United States Patent [19]

Giffard

[11] 4,004,217
[45] Jan. 18, 1977

[54] FLUX LOCKED LOOP

[75] Inventor: Robin P. Giffard, East Palo Alto, Calif.

[73] Assignee: S.H.E. Corporation, San Diego, Calif.

[22] Filed: Oct. 31, 1975

[21] Appl. No.: 627,703

[52] U.S. Cl. .............................. 324/43 R; 307/306; 323/44 F
[51] Int. Cl.[2] ....................................... G01R 33/02
[58] Field of Search ..................... 324/34 R, 43, 47; 307/306; 323/44 F; 321/8 CD; 340/173, 166 SC; 335/216; 336/DIG. 1; 338/325

[56] References Cited

OTHER PUBLICATIONS

Forgacs et al., Lock-On Magnetometer Utilizing a Superconducting Sensor, IEEE Trans on Inst., vol. 11–15; No. 3 Sept. 1966 pp. 113–120.
Silver et al., Quantum States & Transition in Weak Connected Superconducting Rings, Phys. Rev., vol. 157, No. 2, May 10, 1967, pp. 317–341.

Primary Examiner—Robert J. Corcoran
Attorney, Agent, or Firm—Christie, Parker & Hale

[57] ABSTRACT

A flux locked loop, employing a squid in connection with the production of the locked-loop error signal, includes circuitry which renders the locked loop more immune to disturbance inputs such as a ground-loop noise and interference transients and which facilitates a scale factor adjustment of a sub-carrier drive signal for the squid. To minimize ground-loop noise disturbance effects, a portion of the circuitry in the feedback path of the locked loop includes a voltage-responsive converter circuit arrangement providing a current-drive feedback signal for coupling to the squid. To minimize interference transient disturbance effects, a portion of the circuitry in the forward path of the locked loop includes a circuit arrangement having a non-linear transfer characteristic defining opposed substantial attenuation regions separated by a generally linear gain region. To facilitate adjustment of the scale factor to a desired value, a portion of the circuitry provides for an open-loop operation in which a test-mode oscillating signal is coupled to the squid along with an operating-mode modulation drive signal. This causes a heterodyning process to take place such that the frequency spectrum of the electrical signal does not contain frequency components at or near the frequency of the test-mode oscillating signal under circumstances in which the modulation drive signal has been adjusted to the desired value.

7 Claims, 6 Drawing Figures

FLUX LOCKED LOOP

BACKGROUND OF THE INVENTION

1. General Description of the Field of the Invention

The general principles underlying the construction and operation of prior art flux lock loops are taught in various printed publications. In particular, reference is made to an article entitled "Lock-On Magnetometer Utilizing a Superconducting Sensor", by R.L. Forgacs, which appeared in the September, 1966 issue of IEEE Transactions of Instrumentation and Measurement. The flux locked loop particularly described therein employs a squid (superconducting quantum interference device) having two weak links, and is embodied in an instrument for measuring magnetic fields.

The squid used in a flux locked loop need not be of the type having two weak links. In this connection, reference is made to U.S. Pat. No. 3,622,881 to Silver et al, which shows a flux locked loop employing a squid with a single weak link. This patent also shows that it is known to embody a flux locked loop in an instrument other than a magnetometer. In particular, Silver et al describe instruments such as voltmeters and voltage generators embodying flux locked loops.

In a flux locked loop, a squid defines an aperture through which a time-varying amount of flux is threaded. The squid is biased such that it exhibits a periodic transfer characteristic. Different types of biasing techniques are used for different types of squids.

For a squid having two weak links, a direct current biasing technique is typically used in which first and second pairs of wires are electrically connected to the squid for carrying bias current and for carrying a squid output signal respectively. With this technique, the biasing current flowing through the first pair of wires is direct current and this direct current flows through the squid with the two weak links being in parallel paths with respect to the current flow. For a super-conducting region of operation (i.e., while device current is less than the critical current), the voltage appearing between the two wires of the second pair, which are connected across the parallel weak lines, is null. For a quenched region of operation (i.e., while device current is greater than the critical current), a voltage drop appears across the parallel weak links. In short, the squid output voltage appearing across the parallel weak links constitutes a critical-current-representing signal. Critical current is a periodic function of the amount of flux threading the squid aperture. Accordingly, under properly biased conditions, the double-weak-link squid exhibits a periodic transfer characteristic. Thus, where the time-varying amount of flux increases continuously, for example, the squid output voltage signal varies back and forth between maximum and minimum values, with a periodicity determined by a universal constant ($h/2e$, where $h$ is Planck's constant and $e$ is electronic charge).

For a squid having a single weak link, an alternating current biasing technique is typically used. In this technique, a relatively high frequency carrier signal is applied to a tuned circuit inductively coupled to the squid so as to expose the squid to an oscillatory biasing flux. As a result, a screening current is induced in the squid whereby the device critical current can be cyclically exceeded. Under properly biased conditions, the single-weak-link squid and associated circuitry (such as the tuned circuit and a demodulator for the carrier signal) exhibit the same kind of periodic transfer characteristic as described above, and operate to provide a critical-current-representing signal.

From what has so far been described, it will be appreciated that, with either type of squid, the flux cannot be uniquely or unambiguously determined from the critical-current-representing signal itself. That is, the critical-current-representing signal has the same value for a plurality of different discrete values of flux. Moreover, the slope of the transfer characteristic, unlike the periodicity thereof, is not determined by a universal constant and varies from device to device. It is for these reasons that feedback is employed in a flux locked loop.

As shown by the above-referenced Forgacs' article, one arrangement employing feedback includes a feed-forward path and a feedback path. A field coil in the feedback path receives a feedback current, and, the flux it thereby produces affects the amount of flux threading the squid aperture. In addition to receiving the feedback current, the field coil also receives the output of an oscillator. As a result of this arrangement, an electrical signal having a modulation frequency component is produced in the feedforward path. A synchronous detector demodulates this electrical signal to produce an error signal which is applied to an integrator forming the output stage of the feedforward path. Owing to the memory provided by the integrator, the error signal can be nulled and yet the integrator output signal can be representative of the amount of flux being measured.

2. Problems Incurred With Prior Art Flux Locked Loops

One of the problems incurred with prior art flux locked loops relates to the effects of ground-loop noise disturbances. In this connection, it should be understood that the squid and any coil coupled to it are disposed in a cryostat and cooled to a superconducting-temperature level of about 4° Kelvin. It is preferable, of course, for most of the circuitry of the flux locked loop to operate in a room-temperature environment. It is necessary to use relatively thin wires to make the electrical connection between the coil and the circuitry. These wires, being exposed to a substantial temperature gradient, exhibit thermo electric voltages causing disturbance inputs. Moreover, this electrical connection in general involves connections between dissimilar metals. Again, this is a source of a thermo electric voltage disturbance input.

Separately, it is desirable to use a single coil lightly coupled to the squid to perform multiple functions. That is, a simpler mechanical structure is obtained where the same coil is used for radio frequency carrier excitation of the squid and for receiving feedback current. Where a single coil is used, it is necessary to electrically connect one terminal of the coil to the cryostat. The grounding of the coil to the cryostat and the spacing of the coil from the room-temperature circuitry are principal factors underlying ground-loop disturbances. In particular, ac and dc currents flow as a result of such ground loops with the undesirable result of noise voltages being developed in the feedback circuitry. In a prior art arrangement such as that disclosed in the Forgacs' article, where a simple series feedback resistor is used, the effect of the ground-loop disturbance can be expressed as $i_{FB}=[(V_o/R_{FB})+(E_e/R_{FB})]$. In this equation, $i_{FB}$ represents the feedback current to the coil; $V_o$ represents the analog output voltage of the feedforward path; $Ee$ represents the Thevinen equivalent voltage of the ground-loop noise voltages; and $R_{FB}$ represents the feedback resistor. Ideally, $i_{FB}$ should equal $V_o/R_{FB}$. Thus, the foregoing equation shows that $i_{FB}$ is in error by an amount $Ee/R_{FB}$.

Another problem with prior art flux locked loops is as follows. The multi-valued, periodic transfer characteristic exhibited by the squid renders the flux locked loop susceptible to an undesirable shift from one lock point to another. That is, under given conditions, the operating point of the squid with respect to its transfer characteristic can be locked at a particular point within a first linear region thereof. Then, a disturbance input such an interference transient can cause circuitry within the feedforward path to develop a relatively large voltage. The integrator in the feedforward path can respond to this noise voltage whereby its output voltage swings sufficiently to cause the operating point of the squid to shift to a second linear region of the transfer characteristic. The result is a most undesirable permanent offset error.

Another problem with prior art flux locked loops is as follows. The multi-valued, periodic function relating the error signal to the average flux may be expressed in general form as:

$$u_2 = \sum_{n=1}^{\infty} A_n \cos 2\pi n (u_1/u_0)$$

The foregoing equation defines a Fourier series with coefficients $A_n$. The term $u_o$ represents the period of the transfer function. The symbol $\phi_o$ is often used in the literature to refer to the period of the transfer function. Hereinafter, $\mu_o$ and $\phi_o$ are used interchangeably. To obtain an optimum feedback system, a modulation technique is employed. That is, an oscillator operating at a modulation frequency $w_m$ and a coil responsive thereto cooperate to modulate the flux threading the squid aperture. This has the effect of heterodyning input signals to form sidebands of the modulation frequency. The heterodyning process is most efficient when the amplitude of the modulating wave is exactly $\phi_o/2$. The prior art flux locked loops have not been arranged in a manner that facilitates adjusting the modulation to achieve this desirable condition.

SUMMARY OF THE INVENTION

This invention is directed to a flux locked loop. The flux locked loop includes a squid which defines an aperture through which a time-varying amount of flux is threaded. The squid forms an element of error-signal defining means for producing an electrical signal having a modulation frequency component. The magnitude of this modulation frequency component defines the error signal, and varies as a periodic function of the average amount of flux threading the squid aperture during a cycle of the modulation frequency component.

In addition to the squid, the error-signal defining means includes biasing means coupled to the squid for causing the error-signal defining means to exhibit a periodic transfer characteristic. Preferably, the biasing means includes a radio frequency oscillator and a coil which is lightly coupled to the squid and which is driven by the radio frequency oscillator. The error-signal defining means further includes modulation circuit means coupled to the squid and defining the frequency of the modulation frequency component. It further includes feedback-signal summing means for controlling the average amount of flux in response to a feedback current.

The flux locked loop further includes feedforward circuit means responsive to the modulation frequency component of the electrical signal for producing an analog output signal. As indicated above, the squid is preferably biased by an alternating current biasing technique. The frequency of this alternating current is a carrier frequency. The feedforward path thus preferably includes a detector circuit for demodulating the carrier. It also includes, in accordance with conventional practice, a synchronous detector for demodulating the modulation frequency component or subcarrier to produce the error signal, and an integrator responsive to the error signal for providing the analog output signal. The flux locked loop further includes feedback circuit means responsive to the analog output signal for supplying the feedback current to the summing means for nulling the error signal.

To minimize the above-described problem as to ground-loop disturbance effects, an embodiment of the invention includes a closed-loop circuit arrangement forming part of the feedback circuit means. The closed-loop circuit arrangement produces the feedback current in an amount which is proportional to the analog output signal and which is substantially unaffected by disturbance inputs such as ground-loop noise. Preferably, this circuit arrangement includes summing amplifier means, a fixed resistor, and sensing amplifier means which are coupled together to define a closed loop operative to control the current flowing through the fixed resistor.

To minimize the above-described problem as to interference transients, an embodiment of the invention includes transient rejection means. In particular, a buffer circuit is provided for effecting transient rejection. The buffer circuit includes means for shaping its transfer characteristic to define opposed substantial attenuation regions separated by a generally linear gain region. In the absence of interference transients, the electrical signal produced by the error-signal defining means varies within predetermined bounds, and the flux locked loop error signal is at or near a null. Under these conditions, the buffer circuit provides substantially constant gain in the path of signal propagation to the integrator. When a substantial interference transient occurs, noise spikes occur which exceed the normal predetermined range. Under these conditions, the buffer circuit provides substantial attenuation in the path of signal propagation to the integrator. This has the important advantage of preventing the undesirable effect of a permanent offset error incident to a shift in lock point.

To facilitate scale factor adjustment of the squid transfer characteristic, an embodiment of the invention is arranged as follows. A portion of the circuitry provides for an open-loop test operation in which a test-mode oscillating signal is coupled to the squid along with the modulation drive signal. For reasons explained hereinafter, this has the effect of causing a heterodyning process to take place. In particular, under circumstances in which the modulation drive signal has been adjusted to the desired value, the frequency spectrum of the electrical signal produced by the error-signal defining means is composed entirely of sidebands of the modulation frequency. As a further facilitating feature, a meter is provided for monitoring the adjustment, and when the meter is nulled, the adjustment is complete.

DETAILED DESCRIPTION

Figure 1:
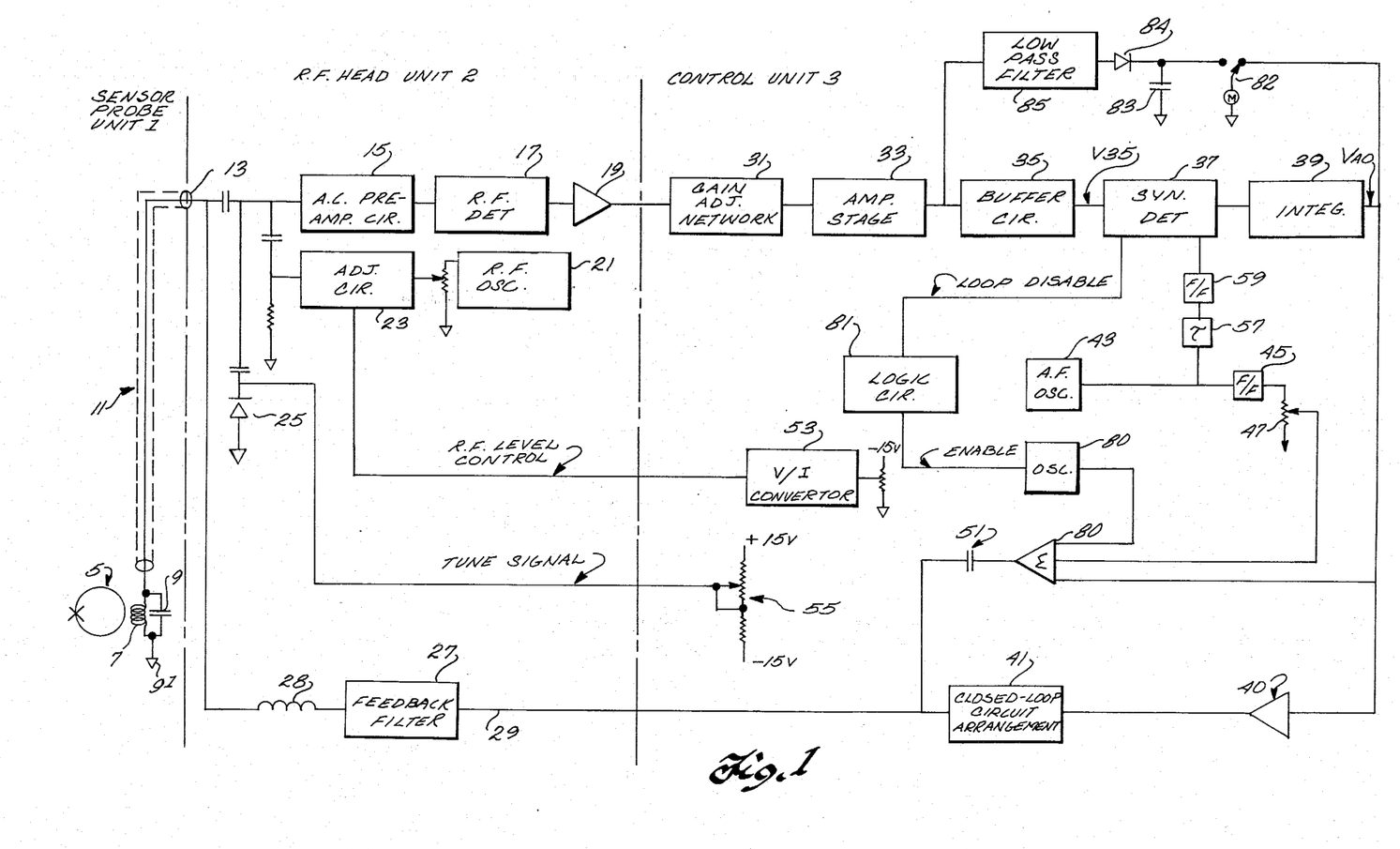
FIG. 1 is an overall block and schematic diagram of a flux locked loop embodying this invention.

The flux locked loop of FIG. 1 is embodied in a magnetometer, and comprises three units. The first unit, indicated generally at 1, is a sensor probe unit; the second unit, indicated generally at 2, is an r.f. head unit; and the third unit, indicated generally at 3, is a control unit.

A squid 5 in the sensor probe has a single weak link. A squid tuned circuit comprising a coil 7 and a capacitor 9 are positioned adjacent the squid in a cryostat (not shown) for reducing the temperature to a superconducting-temperature level. As is conventional where a single coil is lightly coupled to a squid, coil 7 has one end electrically grounded to the cryostat. A coaxial cable 11 terminating in an N type coaxial fitting is also positioned in the sensor probe. The center conductor of the coaxial cable electrically connects one end of coil 7 to a signal input terminal 13 of the r.f. head unit.

In the r.f. head unit, terminal 13 is capacitively coupled to A.C. preamplifier circuitry 15 which drives an r.f. detector 17. A head output amplifier 19 buffers the output of r.f. detector 17 for driving a cable connecting the r.f. head unit to the control unit.

The r.f. head unit also includes a portion of the circuitry involved in biasing the squid. In particular, an r.f. oscillator 21 is used to generate a carrier signal at about 19 MHz (megahertz). The carrier signal is coupled through a carrier level adjustment circuit 23 comprising a conventional diode ring modulator. The level adjustment circuit attenuates the carrier signal in accordance with an r.f. level control signal. The attenuated carrier signal is coupled to the squid tuned circuit in the sensor probe. A "varicap" diode 25 is capacitively coupled so as to be in parallel-circuit-relationship with the squid tuned circuit. A tune signal controls the varicap diode so that the tuned circuit and all stray capacitances are resonated at the carrier frequency.

The r.f. head unit also includes circuit means which responds to a feedback current. To this end, a feedback filter 27 is connected in tandem with an inductor 28. A feedback current is provided to feedback filter 27 on a signal lead 29 for coupling through feedback filter 27 and inductor 28 to the squid tuned circuit. In addition to the feedback current, signal lead 29 carries a modulation drive signal provided by control unit 3. That is, the feedback current and the modulation drive signal are summed together. Controlling the amount of the feedback current in turn provides for controlling the average amount of flux threading the squid aperture during a cycle of the modulation frequency.

With the above-described arrangement, head output amplifier 19 produces an electrical signal having a modulation frequency component the magnitude of which defines the error signal for the flux locked loop. In this connection, reference is made to the graph of FIG. 2, which plots the magnitude of the modulation frequency component as the ordinate and the feedback current as the abscissa, where the input flux being measured by the squid is constant. It will be appreciated from FIG. 2 that the error signal varies as a periodic function. In a specific embodiment, the typical amplitude $V_A$ is approximately 100 mv, and the change in feedback current corresponding to a single $\phi_o$ flux quantum [$2 \times 10^{-15}$ Wb] is 1 microamps ($\mu$a).

With reference again to FIG. 1, there will now be described the feedforward circuit means in control unit 3. A gain adjustment network 31 is provided, and an amplifier stage 33 is connected in tandem therewith. The output signal V33 of amplifier stage 33 is applied to a buffer circuit 35 which produces a signal V35. The buffer circuit 35 provides advantageous feature as to transient rejection and will be described in more detail hereinafter. For an overall understanding of the general operation of the flux locked loop, it bears mention here that buffer circuit provides substantially constant gain in the absence of interference transients.

A conventional synchronous detector 37 is provided in the feedforward circuit means for producing the error signal. Detector 37 receives a loop disable signal during a test-mode described hereinafter. An integrator 39 integrates the error signal to provide an analog output signal $V_{40}$. Owing to the memory provided by the integrator, the error signal can be nulled and yet the analog output signal can be representative of the amount of flux being measured.

The control unit 3 also includes feedback circuit means responsive to the analog output signal for supplying the feedback current. An advantageous feature of the feedback circuit means resides in a closed-loop circuit arrangement 41 for producing the feedback current in an amount which is proportional to the analog output signal and which is substantially unaffected by disturbance inputs such as ground-loop noise. The features of circuit arrangement 41 will be described in more detail hereinafter in connection with the description of FIGS. 3 and 4.

As indicated above, the flux locked loop of FIG. 1 employs a modulation technique. To this end, an audio frequency oscillator 43 is provided in control unit 3. In a specific embodiment, oscillator 43 generates a 100KHz oscillating reference signal. A flip-flop 45 operates as a divide-by-two counter to provide a 50KHz signal. A manually adjustable potentiometer 47 is responsive to the 50KHz signal. An operational amplifier 49 provides for summing the output of potentiometer 47 and the analog output signal to form a combined signal having modulation drive signal component. A capacitor 51 couples this combined signal so that it is summed with the output current of circuit arrangement 41.

As depicted in FIG. 1, control unit 3 also includes circuitry, including voltage-to-current converter 53, for providing an r.f. level control signal to carrier level adjustment circuit 23. It also includes circuitry indicated generally at 55 for providing the tune signal to varicap diode 25. The tune signal is an adjustable d.c. voltage.

Control unit 3 also includes circuitry for providing a synchronizing signal to synchronous detector 37. This includes a conventional delay circuit 57 and a divide-by-two flip-flop 59 that are connected in tandem between oscillator 43 and synchronous detector 37.

The function and operation of other elements of control unit 3 which have not been described above will be better understood after considering in more detail FIGS. 3–6.

Figure 3:
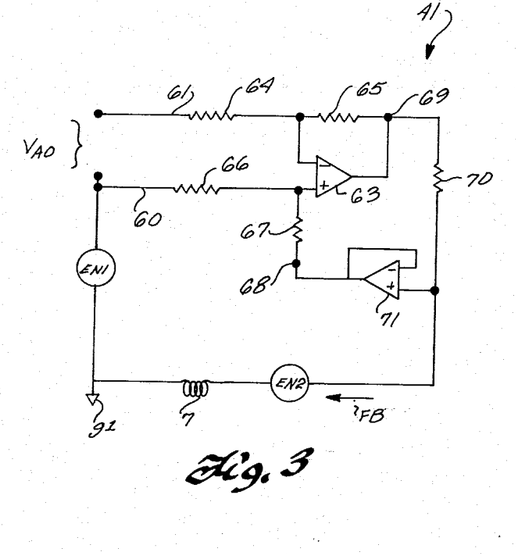
FIG. 3 is a simplified block and schematic diagram of a voltage-to-current converter.

The simplified block diagram of FIG. 3 is provided to assist an understanding of the manner in which circuit arrangement 41 renders the flux locked loop more immune to disturbance inputs such as ground-loop noise.

As indicated in FIG. 3, the analog output signal $V_{AO}$ is defined by the potential difference between two signal leads 60 and 61. The squid coil 7 has one terminal connected to the cryostat ground ($g_1$). Owing to a number of factors discussed in detail in the section headed "Background of the Invention," a small but variable and unknown potential difference exists between the cryostat and signal lead 60. This potential difference is represented in FIG. 3 by a Thevinen equivalent voltage source EN1. Also as a result of these factors, another small, but variable and unknown potential is induced in the center conductor of coaxial cable 11 which carries the feedback current to squid coil 7. This induced potential difference is represented in FIG. 3 by a Thevinen equivalent voltage source EN2.

It will be recalled that prior art arrangements have simply employed a resistor connected in a series feedback path. With such an arrangement, the feedback current varies directly with the changes in EN1 and EN2.

In contrast, closed-loop circuit arrangement 41 operates as a voltage-responsive converter providing feedback current in an amount that is substantially unaffected by either EN1 or EN2. In particular, operational amplifier 63 and identical resistors 64, 65, 66, and 67 form a summing amplifier means. The summing amplifier means has a differential input for receiving the analog output signal at 61 and 60. It also has a reference level input at 68, and an output at 69. A fixed resistor 70 is provided. The feedback current $i_{FB}$ flows through resistor 70. An operational amplifier 71 is connected to provide unity gain and serves as sensing amplifier means.

As a simple example illustrating the sensing operation consider the following. Assume that $V_{AO}$ equals zero volts. Under this condition, $i_{FB}$ should also be zero. Assume further, however, that a noise voltage EN2 is induced. Sensing amplifier 71 will sense this noise voltage and change the reference level input to the summing amplifier means by the identical amount. Thus, the output 69 of the summing amplifier means will change by the identical amount. The net result, then, is that no potential difference will appear across resistor 70 and thus no feedback current will flow. Expressing the foregoing in more general terms, the transfer admittance ($i_{FB}$/EN2) is zero where each of the four resistors has the same value and the input impedance of amplifier 71 is neglected. Similarly, the transfer admittance ($i_{FB}$/EN1) is zero under these conditions.

Figure 4:
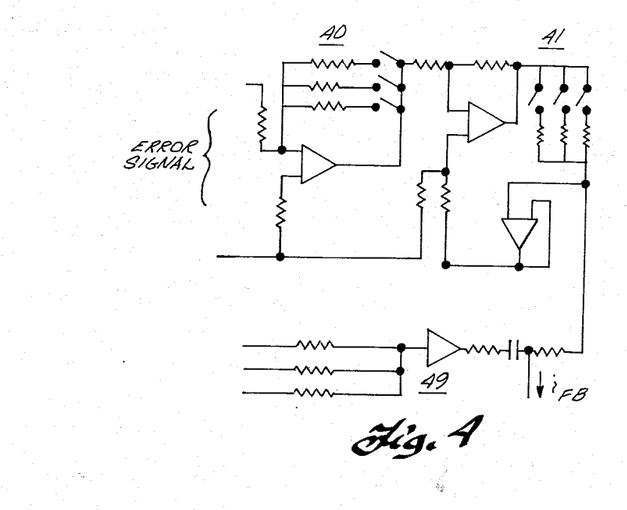
FIG. 4 is a block and schematic diagram of the voltage-to-current converter of FIG. 1 and circuitry associated therewith.

FIG. 4 shows in more detail the circuit arrangement 41 and associated circuitry. As to the depiction of circuit arrangement 41 itself, FIGS. 3 and 4 are generally similar. An additional showing made in FIG. 4 relates to switches for selecting different feedback resistors. Thus, the closed-loop gain of the overall flux locked loop can be selected in this specific embodiment. So that the open-loop gain remains the same, different feedback resistors are switchably connected in to control the gain of amplifier stage 40.

Figure 5:
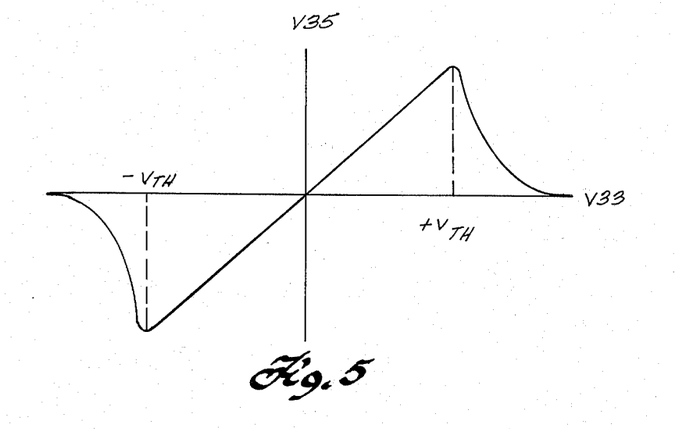
FIG. 5 is a graph illustrating the non-linear transfer characteristic of the buffer circuit 35 of FIG. 1.
Figure 6:
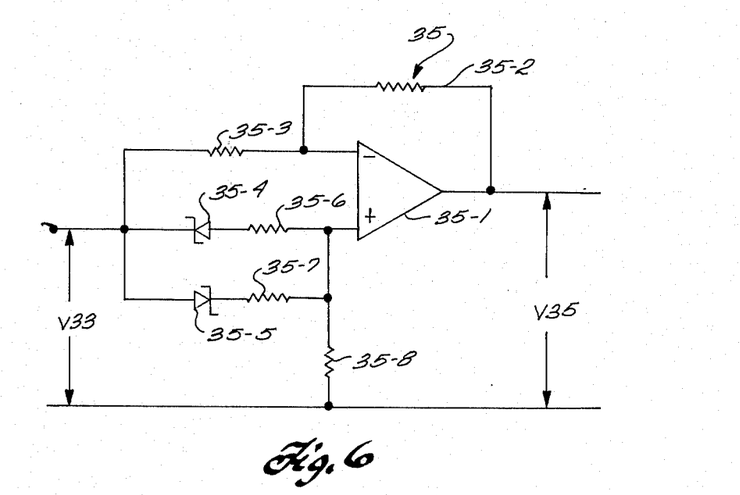
FIG. 6 is a block and schematic diagram of a buffer circuit exhibiting the transfer characteristic of FIG. 5.

With reference now to FIGS. 5 and 6, there will now be explained in more detail the features of buffer circuit 35.

The graph of FIG. 5 plots signal V35 produced by buffer circuit 35 as the ordinate and signal V33 applied to buffer circuit 35 as the abcissa. For a region between opposed thresholds $-V_{TH}$ and $+V_{TH}$, the graph shows that V35 varies linearly with V33. In other words, the transfer function of buffer circuit 35 has a constant gain region. If the absolute magnitude of V33 exceeds the threshold, buffer circuit 35 provides substantial attenuation.

A circuit exhibiting this transfer function is depicted in FIG. 6. An operational amplifier 35-1 is connected to a feedback resistor 35-2 and an input resistor 35-3. Operational amplifier 35-1 has its non-inverting input connected to a non-linear network comprising zener diodes 35-4 and 35-5, and input resistors 35-6, 35-7, and 35-8.

When buffer circuit 35 operates in its linear region, neither of the zener diodes conducts. Thus the non-linear network does not propagate signal V33 to the non-inverting input of amplifier 35-1. In this linear region, then, the gain of buffer circuit 35 is determined by the ratio of feedback resistor 35-2 to input resistor 35-3.

When the signal V33 is more positive than $+V_{TH}$, zener diode 35-4 conducts. Thus, signal V33 is propagated not only to the inverting input (via resistor 35-3) but also to the non-inverting input (via the non-linear network). By virtue of the summing action of operational amplifier 35-1 there is therefore a substantial attenuation in circumstances in which signal V33 is substantially more positive than $+V_{TH}$. In similar manner, zener diode 35-5 conducts when signal V33 is more negative than $-V_{TH}$. Accordingly, the transfer characteristic of buffer circuit 35 is symmetrical.

Owing to the features of buffer circuit 35, the flux locked loop of FIG. 1 is rendered more immune to disturbance inputs such as interference transients. Such interference transients may enter the system in a variety of places. For example, such interference transients are commonly observed at the squid tuned circuit in the sensor probe unit, at various tuned circuits used in the A.C. preamplifier circuitry in the r.f. head unit, the cable connecting the r.f. head unit to the control unit, etc.

By following sound engineering practices such as proper shielding and the like, these interference transients can be reduced to a degree. As a practical matter, however, they cannot be eliminated. In a flux locked loop, more so than in other types of locked loops, the effects of interference transients can be extremely troublesome.

Figure 2:
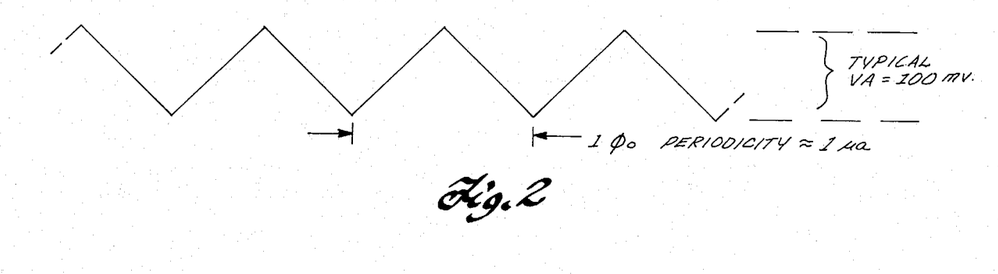
FIG. 2 is a graph illustrating the periodic transfer characteristic exhibited by the squid and the associated circuitry within the r.f. head unit of FIG. 1.

In this connection, reference is again made to the graph of FIG. 2. With a given, constant input flux, and in the absence of an interference transient, the flux locked loop operates at a lock point such that the magnitude of the modulation frequency component is null. If an interference transient is permitted to propagate in a signal path such that $i_{FB}$ changes by an amount corresponding to $\frac{1}{2}\phi_o$, then a change in polarity of the transfer characteristic results. The flux lock loop will not operate stably under this condition. Instead, the flux locked loop will remain locked with the undesirable result that a permanent offset error appears in the analog output signal.

The advantage of buffer circuit 35 is that it precludes such transient interference propagation and thereby keeps the flux locked loop operating on the same polarity piece-wise linear region of the transfer characteristic.

With reference again to FIG. 1, there will now be explained a feature of the flux locked loop which facilitates scale factor adjustment. A relatively low frequency audio oscillator 80 is provided to supply an oscillating test signal drive used in a test mode of operation. In this mode, conventional logic circuitry 81 responsive to actuation of a control panel pushbutton (not shown) provides an enable signal to cause the oscillating test signal to be added to the modulation drive signal. The logic circuitry also provides the loop disable signal to synchronous detector 37 and also causes a switch 82 to connect a meter to a capacitor 83. In normal mode the meter is connected to monitor the analog output signal. Thus, in the test mode, the error signal is not fed back to the squid, and the meter responds to an open-loop signal.

The capacitor 83 is used for smoothing a detected signal provided by a diode 84. The diode 84 is responsive to a conventional low-pass active filter 85 that responds to signal V33.

In a specific embodiment, oscillator 80 operates at 200 Hz, whereas the frequency of the modulation frequency component is 50 KHz.

It will be recalled that the following Fourier series defines the transfer function:

$$u_z = \sum_{n=1}^{\infty} a_n \cos 2\pi n (u_1/u_0)$$

The oscillating test signal is scaled such tha its amplitude $v_t$ is several times $u_0$.

If no modulation drive signal were produced, then the following equations would be applicable:

$$u_1 = v_t \cos \omega_t t$$

and $$u_2 = \sum_{n=1}^{\infty} a_n \cos 2\pi n \left[ \frac{v_t \cos \omega_t t}{u_0} \right]$$

The spectrum of $u_2$ would thus have components at $\omega_t$ and its harmonics.

Under circumstances in which the modulation drive signal is adjusted to have peak-to-peak amplitude of $u_0/2$, the frequency spectrum of $u_2$ is radically altered.

In particular, when so scaled, the modulation drive signal has the effect of shifting the transfer characteristic by one-half a period. It will be appreciated that the shifted periodic waveform is equivalent to the unshifted periodic waveform multiplied by $-1$.

As to the spectrum of the modulation drive signal, the following equation is applicable:

$$S(t) = \sum_{p=0}^{\infty} b_p \sin (2p + 1) \omega_m$$

Thus, the function $u_2$, in the presence of a modulation drive signal having the desired amplitude, is:

$$u_2' = \sum_n a_n' \cos 2\pi n (u_1/u_0)$$

where $$a_n' = a_n \sum_p b_p \sin (2\pi p + 1)\omega_m = a_n S(t)$$

The result of applying the oscillating test signal is to give $$u_2' = \sum_n a_n \sum_p b_p \sin (2p+1)\omega_m \cos 2\pi n \left[ \frac{v_t \cos \omega_t t}{u_0} \right]$$

The spectrum of $u_2'$ is entirely composed of sidebands of $(2p + 1) \omega_m$. In other words, only frequency components that are substantially higher than the frequency of $\omega_t$ will be propagated.

I claim:
1. A flux-locked loop comprising:
a squid defining an aperture through which a time-varying amount of flux is threaded;
error-signal defining means, including the squid, for producing an electrical signal having a modulation frequency component, the magnitude of the modulation frequency component defining the error signal;
the error-signal defining means including
 a. biasing means coupled to the squid for causing the error-signal defining means to exhibit a periodic transfer characteristic such that the error signal varies as a periodic function of the average amount of flux threading the aperture during a cycle of the modulation frequency component,
 b. modulation circuit means coupled to the squid and defining the frequency of the modulation frequency component, and
 c. feedback-signal summing means coupled to the squid for controlling said average amount of flux in response to a feedback current;
feed-forward circuit means responsive to the modulation frequency component of the electrical signal for producing an analog output signal;
feedback circuit means responsive to the analog output signal for supplying the feedback current to the summing means for nulling the error signal; the feedback circuit means including a closed-loop circuit arrangement for producing the feedback current in an amount which is proportional to the analog output signal and which is substantially unaffected by disturbance inputs such as ground-loop noise.
2. The flux locked loop as defined in claim 1, wherein the closed-loop circuit arrangement includes: summing amplifier means having a differential input for receiving the analog output signal, a reference level input, and an ouput; a fixed resistor through which the feedback current flows, the fixed resistor having a first terminal coupled to the output of the summing amplifier means, and a second terminal coupled to the feedback-signal summing means; and sensing amplifier means having an input coupled to the second terminal of the fixed resistor, and an output coupled to the reference level input so that the feedback current flowing through the fixed resistor is controlled to be proportional to the analog output signal.

3. A flux locked loop as defined in claim 2, wherein the squid has a single weak link; a single coil is lightly coupled to the squid, the single coil forming a common element of the biasing means, the modulation circuit means, and the feedback-signal summing means whereby the single coil performs multiple functions; and wherein the fixed resistor is connected in series-circuit-relationship with the single coil.

4. A flux locked loop as defined in claim 3, wherein the modulation circuit means comprises an oscillator for producing a modulation drive signal and a capacitor for coupling the modulation drive signal to the single coil.

5. The flux locked loop as defined in claim 1, wherein the feed-forward path includes: a synchronous detector; means for coupling the electrical signal to the synchronous detector for demodulation of the modulation frequency component to produce the error signal; an integrator for integrating the error signal to produce the analog output signal; and a buffer circuit connected between the squid and the integrator; the buffer circuit including means for shaping its transfer characteristic to define opposed substantial attenuation regions separated by a generally linear gain region.

6. A flux-locked loop comprising:
a squid defining an aperture through which a time-varying amount of flux is threaded;
error-signal defining means, including the squid, for producing an electrical signal having a modulation frequency component, the magnitude of the modulation frequency component defining the error signal;
the error-signal defining means including
 a. biasing means coupled to the squid for causing the error-signal defining means to exhibit a periodic transfer characteristic such that the error signal varies as a periodic function of the average amount of flux threading the aperture during a cycle of the modulation frequency component,
 b. modulation circuit means coupled to the squid and defining the frequency of the modulation frequency component, and
 c. feedback-signal summing means coupled to the squid for controlling said average amount of flux in response to a feedback circuit;
feed-forward circuit means responsive to the modulation frequency component of the electrical signal for producing an analog output signal;
feedback circuit means responsive to the analog output signal for supplying the feedback current to the summing means for nulling the error signal; the feed-forward circuit means including:
 a synchronous detector; means for coupling the electrical signal to the synchronous detector for demodulation of the modulation frequency component to produce the error signal; an integrator for integrating the error signal to produce the analog output signal; and a buffer circuit connected between the squid and the integrator; the buffer circuit including means for shaping its transfer characteristic to define opposed substantial attenuation regions separated by a generally linear gain region.

7. A flux-locked loop comprising:
a squid defining an aperture through which a time-varying amount of flux is threaded;
error-signal defining means, including the squid for producing an electrical signal having a modulation frequency component, the magnitude of the modulation frequency component defining the error signal;
the error-signal defining means including
 a. biasing means coupled to the squid for causing the error-signal defining means to exhibit a periodic transfer characteristic such that the error signal varies as a periodic function of the average amount of flux threading the aperture during a cycle of the modulation frequency component,
 b. adjustable modulation circuit means coupled to the squid and providing an adjustable amplitude oscillating modulation drive signal the frequency of which defines the frequency of the modulation frequency component, and
 c. feedback-signal summing means coupled to the squid for controlling said average amount of flux in response to a feedback current;
feed-forward circuit means responsive to the modulation frequency component of the electrical signal for producing an analog output signal;
feedback circuit means switchably coupled to respond to the output analog signal for supplying the feedback current to the summing means for nulling the error signal in a normal closed-loop operation;
means for facilitating adjustment of the adjustable modulation circuit means so that the oscillating modulation drive signal amplitude is adjusted to a desired value, which includes means for producing a test mode oscillating signal having a frequency substantially lower than the frequency of the modulation drive signal; means for coupling to the squid both the test mode oscillating signal and the modulation drive signal to enable a heterodyning process to take place, a meter, and low pass filtering means responsive to the electrical signal for driving the meter to provide a null indication under circumstances in which the modulation drive signal amplitude has been adjusted to the desired value.

* * * * *

UNITED STATES PATENT AND TRADEMARK OFFICE
CERTIFICATE OF CORRECTION

PATENT NO. : 4,004,217
DATED : January 18, 1977
INVENTOR(S) : Robin P. Giffard

It is certified that error appears in the above-identified patent and that said Letters Patent are hereby corrected as shown below:

Column 1, line 43, "lines should read -- links --; and Column 11, line 57, "circuit" should read -- current --.

Signed and Sealed this

Nineteenth Day of April 1977

[SEAL]

Attest:

RUTH C. MASON
*Attesting Officer*

C. MARSHALL DANN
*Commissioner of Patents and Trademarks*